United States Patent
Guo et al.

(10) Patent No.: US 11,297,722 B2
(45) Date of Patent: Apr. 5, 2022

(54) MULTI-LAYERED CIRCUIT BOARD

(71) Applicants: Avary Holding (Shenzhen) Co., Limited., Shenzhen (CN); QING DING PRECISION ELECTRONICS (HUAIAN) CO., LTD, Huai an (CN)

(72) Inventors: Zhi Guo, Shenzhen (CN); Chao-Feng Huang, Shenzhen (CN)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 0 days.

(21) Appl. No.: 17/084,970

(22) Filed: Oct. 30, 2020

(65) Prior Publication Data
US 2021/0136926 A1    May 6, 2021

Related U.S. Application Data

(62) Division of application No. 16/740,742, filed on Jan. 13, 2020, now Pat. No. 10,881,008.

(30) Foreign Application Priority Data

Oct. 31, 2019    (CN) .......................... 201911049594.4

(51) Int. Cl.
*H05K 1/02*    (2006.01)
*H05K 1/03*    (2006.01)
(Continued)

(52) U.S. Cl.
CPC ............. *H05K 3/462* (2013.01); *H05K 1/115* (2013.01); *H05K 3/4053* (2013.01);
(Continued)

(58) Field of Classification Search
CPC ... H05K 1/02; H05K 1/03; H05K 1/11; H05K 3/02; H05K 3/10; H05K 3/18; H05K 3/20;
(Continued)

(56) References Cited

U.S. PATENT DOCUMENTS

| 6,523,252 B1 * | 2/2003 | Lipponen ................. H01P 3/06 174/251 |
| 2002/0134584 A1 * | 9/2002 | Higuchi ............... H05K 3/4617 174/264 |

(Continued)

FOREIGN PATENT DOCUMENTS

| CN | 103857197 A | 6/2014 |
| CN | 103906371 A | 7/2014 |

(Continued)

*Primary Examiner* — Xiaoliang Chen
(74) *Attorney, Agent, or Firm* — ScienBiziP, P.C.

(57) ABSTRACT

A multi-layered circuit board proofed against conductor loss or diminution when heated includes first and second circuit base boards. Each first circuit base board includes a first dielectric layer and a first wiring layer formed thereon and a first stepped paste block as a conductor formed in the first dielectric layer. The first stepped paste block is electrically connected to the first dielectric layer. Each second circuit base board includes a second dielectric layer and a second wiring layer, a second stepped paste block as a conductor is formed in the second dielectric layer. When pressed together for an electrical interconnection, the paste blocks are sealed and thus captive between the first and second circuit base boards.

5 Claims, 8 Drawing Sheets

(51) Int. Cl.
| | |
|---|---|
| *H05K 1/11* | (2006.01) |
| *H05K 3/02* | (2006.01) |
| *H05K 3/10* | (2006.01) |
| *H05K 3/18* | (2006.01) |
| *H05K 3/20* | (2006.01) |
| *H05K 3/40* | (2006.01) |
| *H05K 3/46* | (2006.01) |
| *H01L 23/00* | (2006.01) |
| *H01L 23/02* | (2006.01) |
| *H01L 23/24* | (2006.01) |
| *H01L 23/40* | (2006.01) |
| *H01L 23/48* | (2006.01) |
| *H01L 23/52* | (2006.01) |

(52) U.S. Cl.
CPC . *H05K 3/4626* (2013.01); *H05K 2201/09518* (2013.01); *H05K 2201/09727* (2013.01); *H05K 2203/0278* (2013.01)

(58) Field of Classification Search
CPC . H05K 3/40; H05K 3/46; H01L 23/00; H01L 23/02; H01L 23/24; H01L 23/40; H01L 23/48; H01L 23/52
USPC ....... 174/264, 250, 251, 255, 257, 258, 259, 174/261, 262, 265, 267; 257/534, 774, 257/751, 777; 438/397
See application file for complete search history.

(56) References Cited

U.S. PATENT DOCUMENTS

| | | | | |
|---|---|---|---|---|
| 2003/0019662 | A1* | 1/2003 | Higuchi | H05K 3/4617 174/250 |
| 2004/0134682 | A1* | 7/2004 | En | C25D 5/34 174/258 |
| 2007/0266559 | A1* | 11/2007 | Lee | H05K 3/4652 29/852 |
| 2010/0059897 | A1* | 3/2010 | Fay | H01L 23/481 257/777 |
| 2013/0319737 | A1* | 12/2013 | Hurwitz | H01L 23/49827 174/257 |
| 2014/0197519 | A1* | 7/2014 | Choi | H01L 28/92 257/534 |
| 2015/0351235 | A1* | 12/2015 | Ogawa | B29C 66/41 428/201 |
| 2016/0086874 | A1* | 3/2016 | Choi | H01L 24/14 257/751 |
| 2016/0204517 | A1* | 7/2016 | Hu | H01Q 21/08 343/824 |
| 2017/0278637 | A1* | 9/2017 | Park | H01G 4/232 |
| 2018/0279472 | A1* | 9/2018 | Sunohara | H05K 1/115 |
| 2018/0310413 | A1* | 10/2018 | Kasai | H01L 23/498 |

FOREIGN PATENT DOCUMENTS

| | | |
|---|---|---|
| JP | 2007-214493 A | 8/2007 |
| JP | 2009-043917 A | 2/2009 |

* cited by examiner

MULTI-LAYERED CIRCUIT BOARD

FIELD

The subject matter herein generally relates to a multi-layered circuit board and a method for manufacturing the multi-layered circuit board.

BACKGROUND

Alivh (any layer inner via hole) multi-layered circuit boards have different wiring layers electrically connected together through plated holes, conductive paste filled holes, or copper bumps. The conductive paste filled hole can reduce the difficulty for manufacturing fine lines or conductive holes with high width-to-thickness ratio, and also has the advantages of being a short process and not harmful environmentally.

The conductive paste may include a base resin and conductive particles dispersed in the base resin. The base resin can serve as adhesive which binds the conductive particles together to form conductive paths. However, laminating the wiring layers at a high temperature may cause the base resin to flow, causing short-circuits and ion migration among the conductive vias. Improvement in the art is desired.

BRIEF DESCRIPTION OF THE DRAWINGS

Implementations of the present technology will now be described, by way of embodiment, with reference to the attached figures.

DETAILED DESCRIPTION

Figure 1:
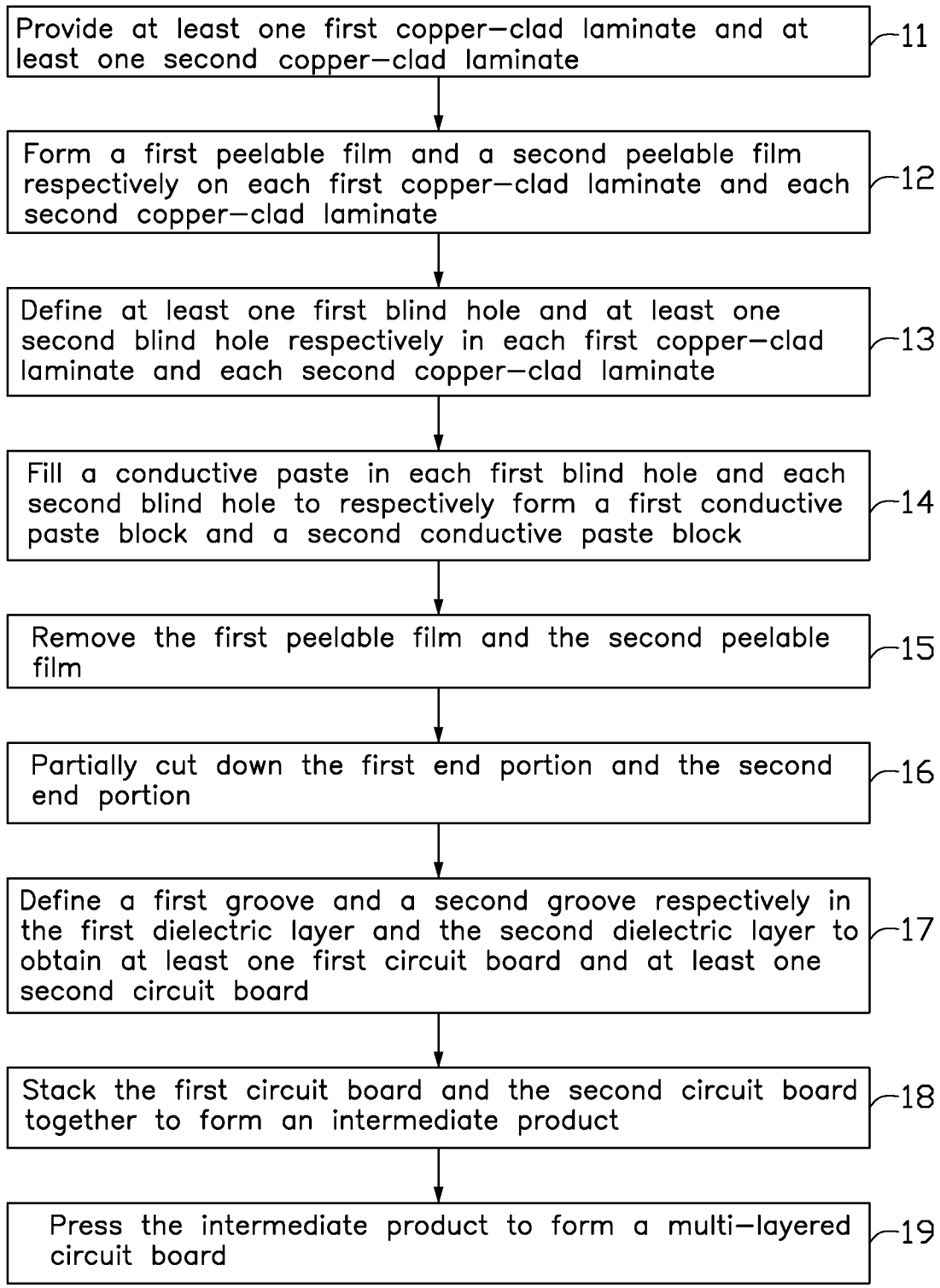
FIG. 1 is a flowchart of an embodiment of a method for manufacturing a multi-layered circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Referring to FIG. 1, a method for manufacturing a multi-layered circuit board 100 (see FIG. 7) is presented in accordance with an embodiment. The method for manufacturing the multi-layered circuit board 100 is provided by way of example, as there are a variety of ways to carry out the method. The method can begin at block 11.

Figure 2:
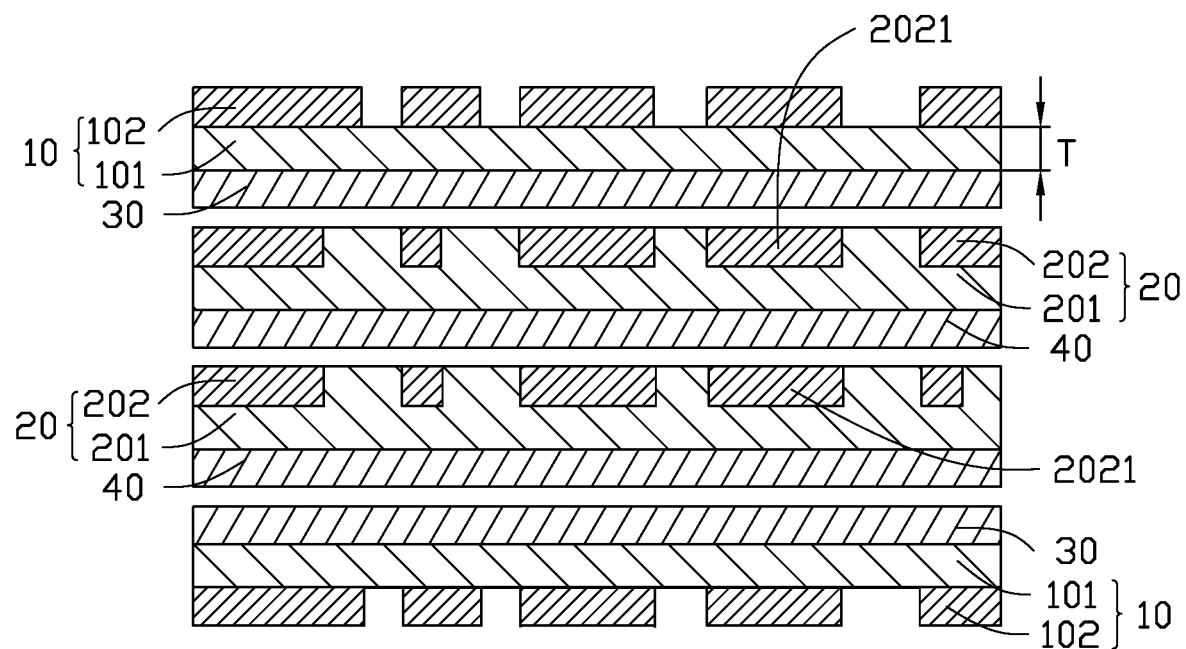
FIG. 2 is a diagrammatic view of at least one first copper-clad laminate and at least one second copper-clad laminate of the method of FIG. 1, after a first peelable film and a second peelable film have been formed on the first copper-clad laminate and the second copper-clad laminate.

At block 11, referring to FIG. 2, at least one first copper-clad laminate 10 and at least one second copper-clad laminate 20 are provided.

The first copper-clad laminate 10 includes a first dielectric layer 101 and a first wiring layer 102 formed on the first dielectric layer 101. The second copper-clad laminate 20 includes a second dielectric layer 201 and a second wiring layer 202 formed on the second dielectric layer 201. In this embodiment, the second wiring layer 202 is embedded in the second dielectric layer 201, with a top surface of the second wiring layer 202 being exposed from the second dielectric layer 201. The second wiring layer 202 includes a plurality of connecting pads 2021.

The first dielectric layer 101 and the second dielectric layer 201 are made of a dielectric material selected from a group consisting of epoxy resin, polypropylene (PP), polyphenylene oxide (PPO), BT resin, polyimide (PI), polyethylene terephthalate (PET), polyethylene naphthalate (PEN), and any combination thereof. In at least one embodiment, the first dielectric layer 101 and the second dielectric layer 201 are made of polypropylene.

The thickness of the first dielectric layer 101 and the second dielectric layer 201 is defined as T, where T is in a range from 5 micrometers to 150 micrometers.

In at least one embodiment, two first copper-clad laminates 10 and two second copper-clad laminates 20 are provided.

At block 12, a first peelable film 30 and a second peelable film 40 are respectively formed on the first dielectric layer 101 of each first copper-clad laminate 10 and the second dielectric layer 201 of each second copper-clad laminate 20.

Figure 3:
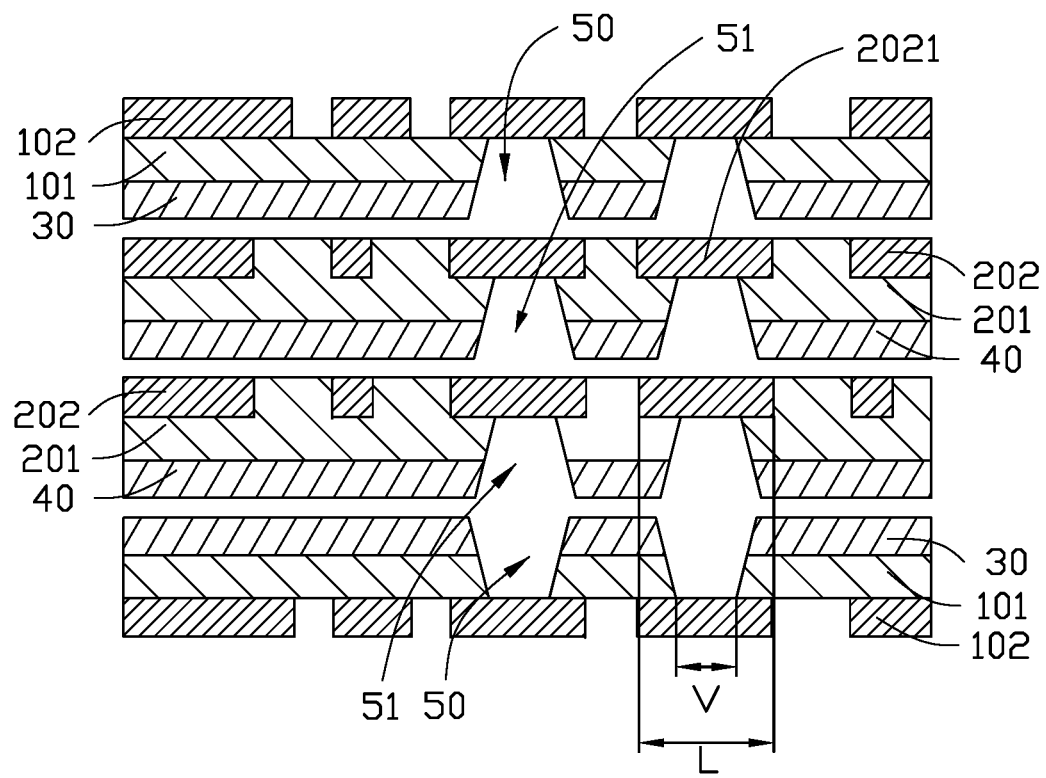
FIG. 3 is a diagrammatic view showing at least one first blind hole and at least one second blind hole defined in the first copper-clad laminate and the second copper-clad laminate of FIG. 2.

At block 13, referring to FIG. 3, at least one first blind hole 50 is defined in each first copper-clad laminate 10, which passes through the first peelable film 30 and the first dielectric layer 101. At least one second blind hole 51 is defined in each second copper-clad laminate 20, which passes through the second peelable film 40 and the second dielectric layer 201.

The width of the first blind hole 50 is decreased from the first peelable film 30 to the first dielectric layer 101. The width of the second blind hole 51 is decreased from the second peelable film 40 to the second dielectric layer 201.

In at least one embodiment, the width of a portion of the first blind hole 50 which is adjacent to the first wiring layer 102 (that is, the smallest width of the first blind hole 50) is substantially equal to the width of a portion of the second blind hole 51 which is adjacent to the second wiring layer 202 (that is, the smallest width of the second blind hole 51). Referring to FIG. 3, such smallest width of the first blind hole 50 and of the second blind hole 51 is defined as V, where V is in a range of 5 micrometers to 150 micrometers. The width of the connecting pad 2021 is defined as L, where L and V satisfy the function (V+5) micrometers≤L≤(V+75) micrometers.

In at least one embodiment, the first blind hole 50 and the second blind hole 51 can be formed by drilling or laser etching.

Figure 4:
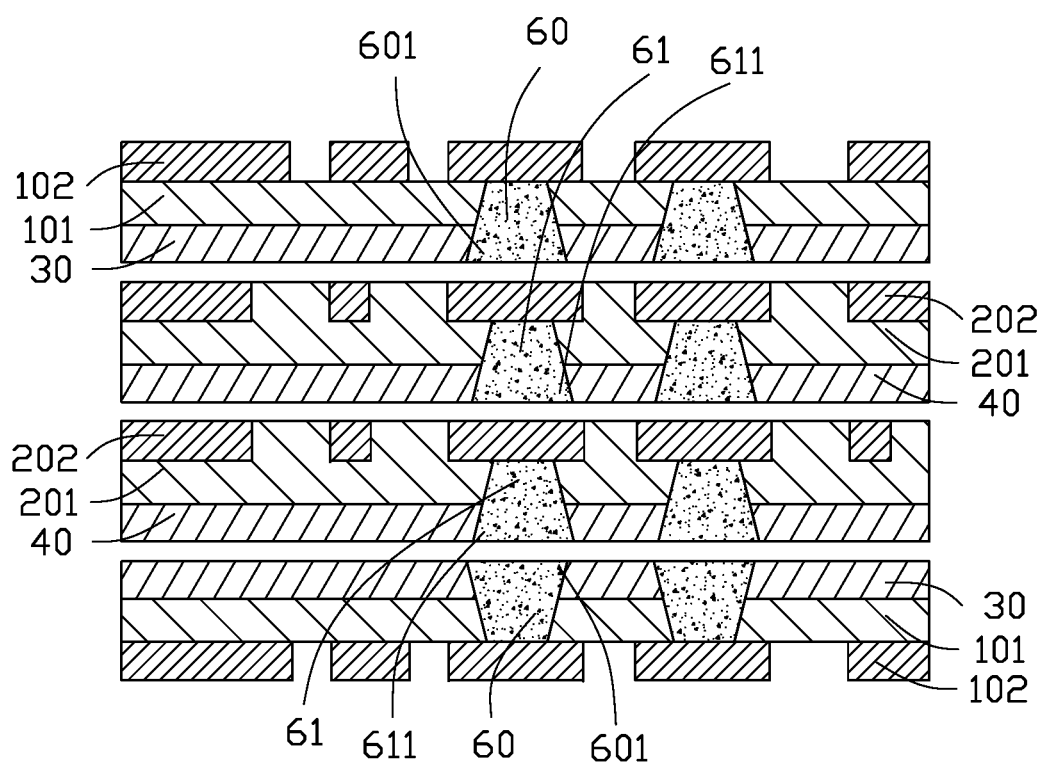
FIG. 4 is a diagrammatic view showing a first conductive paste block and a second conductive paste block infilled into the first blind hole and the second blind hole of FIG. 3.

At block 14, referring to FIG. 4, a conductive paste is infilled into each first blind hole 50 and each second blind hole 51, and is solidified to respectively form a first conductive paste block 60 and a second conductive paste block 61. The first conductive paste block 60 is electrically connected to the first wiring layer 102. The second conductive paste block 61 is electrically connected to the second wiring layer 202.

The first conductive paste block 60 includes a first end portion 601 facing away from the first wiring layer 102. The second conductive paste block 61 includes a second end portion 611 facing away from the second wiring layer 202.

The conductive paste can be solder paste or copper paste. In at least one embodiment, the conductive paste is solder paste.

Figure 5:
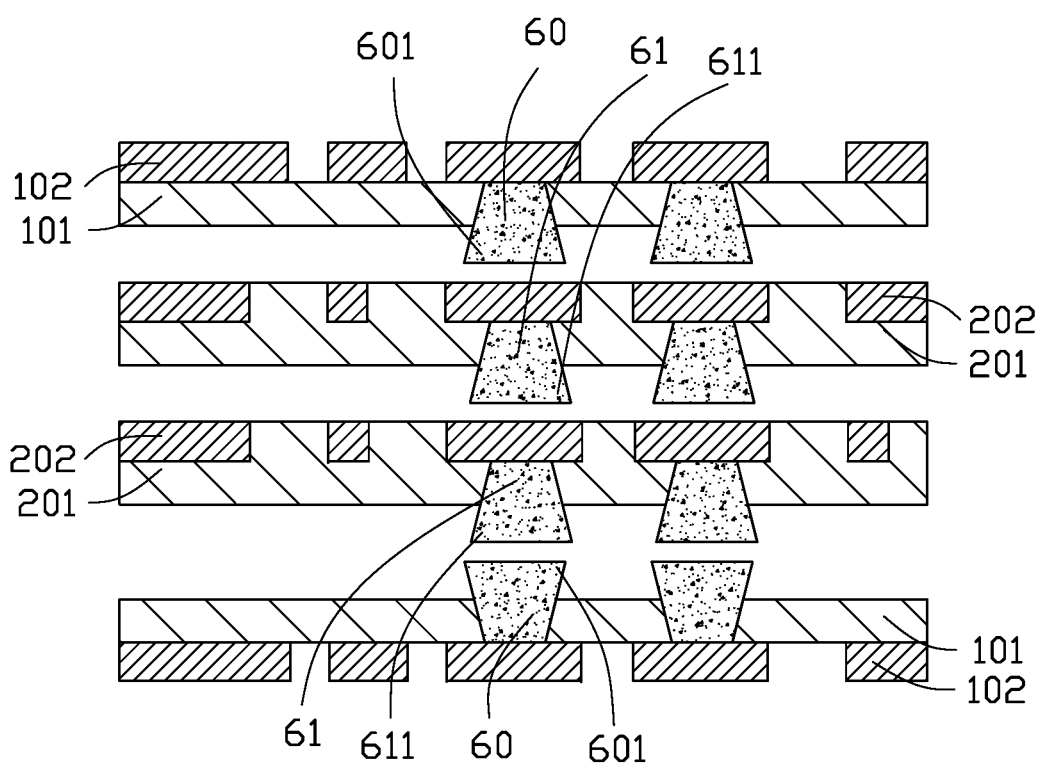
FIG. 5 is a diagrammatic view showing the first peelable film and the second peelable film of FIG. 4 removed.

At block 15, referring to FIG. 5, the first peelable film 30 and the second peelable film 40 are removed, leaving the first end portion 601 and the second end portion 611 to protrude from the first dielectric layer 101 and the second dielectric layer 201.

Figure 6:
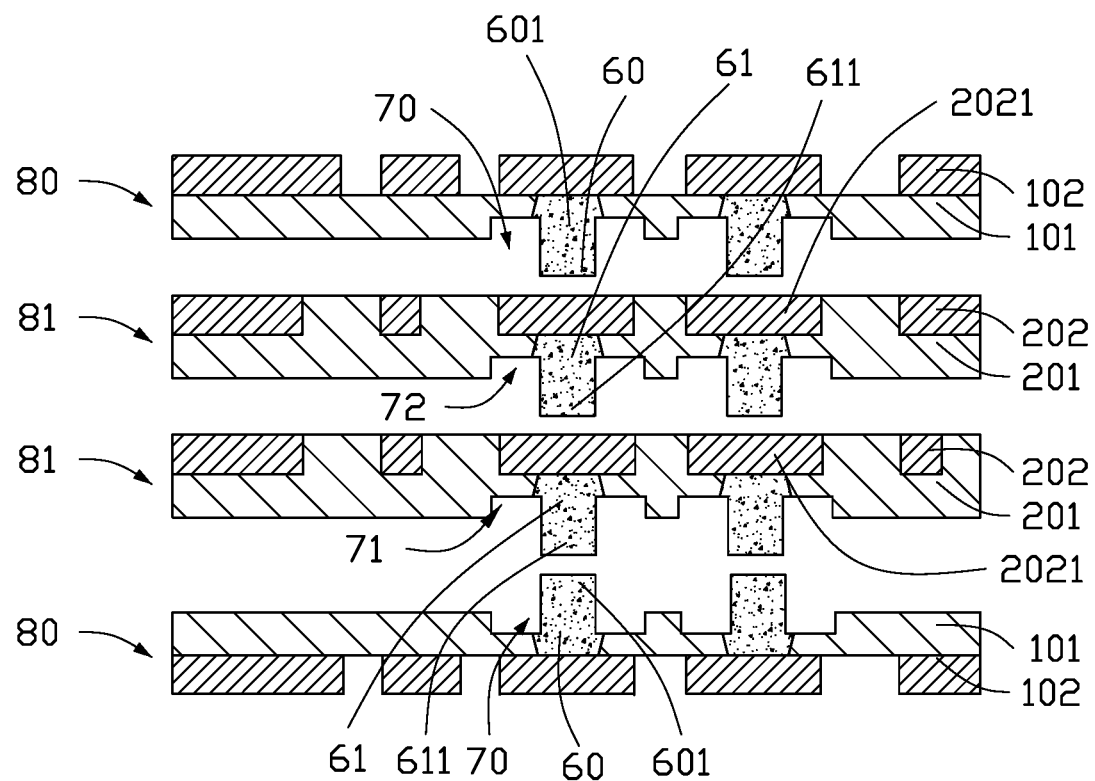
FIG. 6 is a diagrammatic view showing the first conductive paste block and the second conductive paste block of FIG. 5 cut, and a first groove and a second groove being defined around the first conductive paste block and the second conductive paste block to form at least one first circuit base board and at least one second circuit base board.

At block 16, referring to FIG. 6, the first end portion 601 and the second end portion 611 are partially cut down so to as to leave a substantially cylindrical shape.

At block 17, a first groove 70 and a second groove 71 are respectively defined in the first dielectric layer 101 and the second dielectric layer 201, thereby obtaining at least one first circuit base board 80 and at least one second circuit base board 81. The first groove 70 surrounds the first end portion 60 after the cutting. The second groove 71 surrounds the second end portion 61 after the cutting.

At block 18, the at least one first circuit base board 80 and the at least one second circuit base board 81 are stacked together, thereby forming an intermediate product (not shown).

In at least one embodiment, when two first circuit base boards 80 and two second circuit base board 81 are included, one first circuit base board 80, the two second circuit base boards 81, and another one first circuit base board 80 are stacked together in that order. That is, the two second circuit base board 81 are positioned between the two first circuit base boards 80. Furthermore, after being stacked, the first end portion 601 of one first circuit base board 80 faces and is aligned with the connecting pad 2021 of one corresponding second circuit base board 81. The first end portion 601 of another first circuit base board 80 faces and is aligned with the second end portion 611 of another second circuit base board 81. That is, the second end portion 611 of one second circuit base board 81 faces and is aligned with the connecting pad 2021 of another second circuit base board 81.

Figure 7:
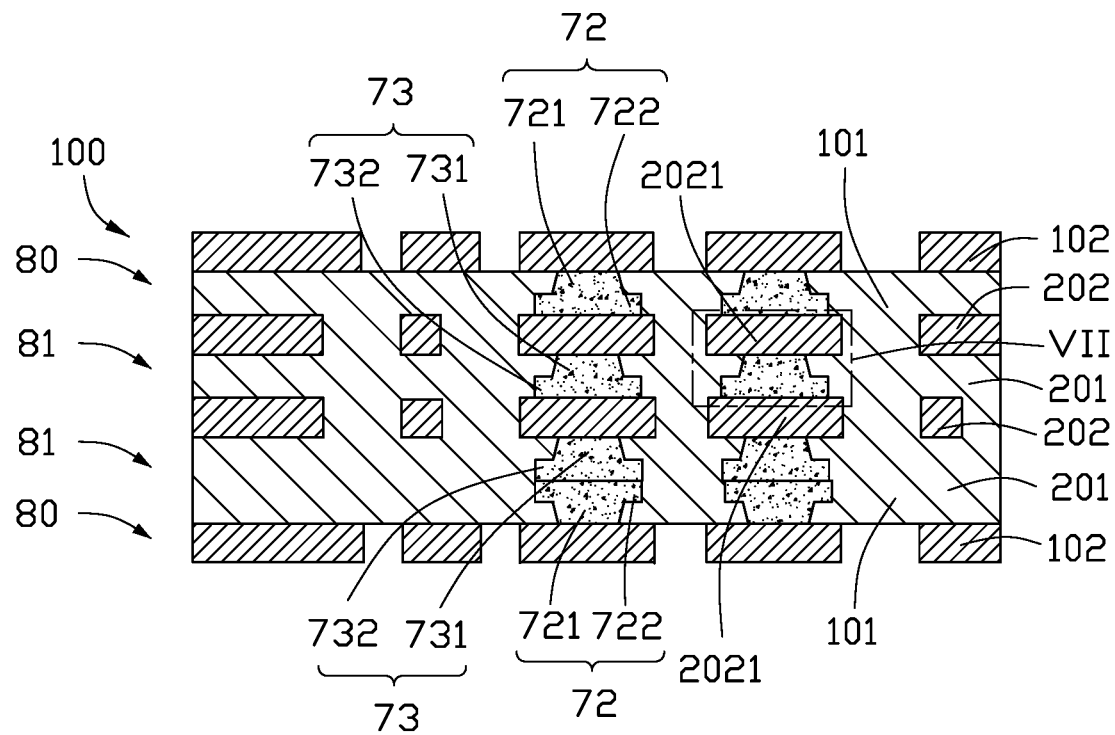
FIG. 7 is a diagrammatic view showing the first circuit base board and the second circuit base board FIG. 6 pressed together to form a multi-layered circuit board.

At block 19, referring to FIG. 7, the intermediate product is pressed, thereby forming the multi-layered circuit board 100.

In at least one embodiment, after being pressed, the first conductive paste block 60 after the cutting is infilled into the first groove 70 to form a first stepped paste block 72. The second conductive paste block 61 after the cutting is infilled into the second groove 71 to form a second stepped paste block 73.

The first stepped paste block 72 includes a first block portion 721 adjacent to the first wiring layer 102 and a second block portion 722 connected to the first block portion 721 and facing away from the first wiring layer 102. The width of the first block portion 721 decreases from the second block portion 722 to the first wiring layer 102. The second stepped paste block 73 includes a third block portion 731 adjacent to the second wiring layer 202 and a fourth block portion 732 connected to the third block portion 731 and facing away from the second wiring layer 202. The width of the third block portion 731 decreases from the fourth block portion 732 to the second wiring layer 202.

Furthermore, after being pressed, the first stepped paste block 72 of one first circuit base board 80 is connected to the connecting pad 2021 of one corresponding second circuit base board 81. That is, the first wiring layer 102 of one first circuit base board 80 is electrically connected to the second wiring layer 202 of one corresponding second circuit base board 81 through the first stepped paste block 72. The first stepped paste block 72 of another first circuit base board 80 is connected to the second stepped paste block 73 of another second circuit base board 81. That is, the first wiring layer 102 of another first circuit base board 80 is electrically connected to the second wiring layer 202 of another second circuit base board 81 through the first stepped paste block 72 and the second stepped paste block 73.

Figure 8:
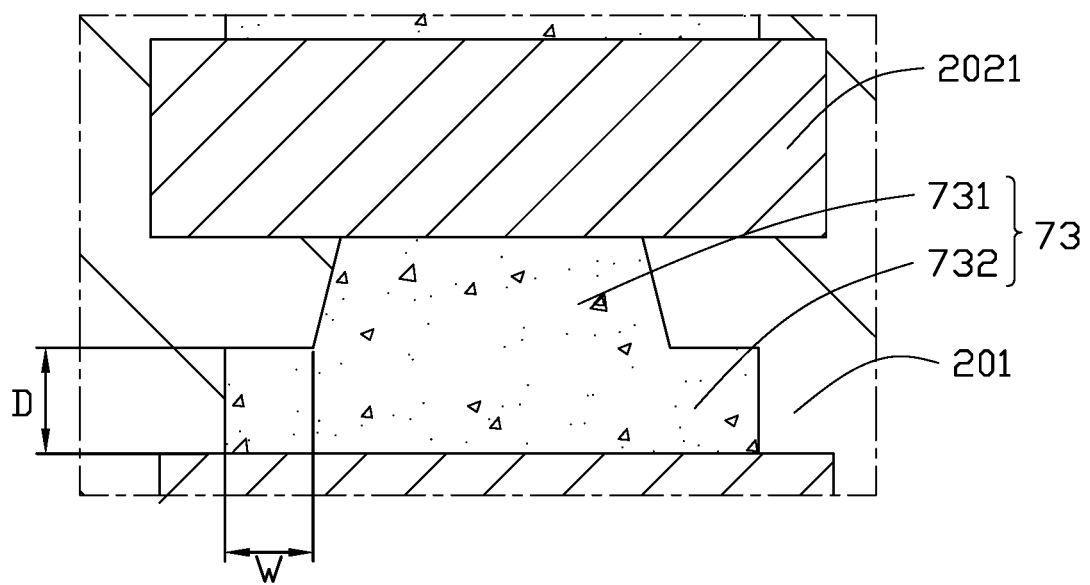
FIG. 8 is an enlarged view of portion VII of FIG. 7.

In at least one embodiment, each of the first and second stepped paste blocks 72 and 73 is substantially T-shaped. Furthermore, the first stepped paste block 72 and the corresponding second stepped paste block 73 that are electrically connected between the first wiring layer 102 and the second wiring layer 202 are connected together. The thickness of the second block portion 722 is substantially equal to the thickness of the fourth block portion 732. Referring to FIG. 8, the thickness of the second block portion 722 and of the fourth block portion 732 is defined as D, where D and T satisfy the function (T+10) micrometers≤D≤(T+30) micrometers.

In at least one embodiment, each side of the second block portion 722 protrudes from the first block portion 721 by a distance, which is defined as W. Each side of the fourth block portion 732 protrudes from the third block portion 731 by the same distance W. W is in a range of 10 micrometers to 50 micrometers.

FIG. 7 illustrates an embodiment of a multi-layered circuit board 100 presented in accordance with an embodiment. The multi-layered circuit board 100 includes at least one first circuit base board 80 and at least one second circuit base board 81 laminated on the at least one first circuit base board 80.

Each first circuit base board 80 includes a first dielectric layer 101 and a first wiring layer 102 formed on the first dielectric layer 101. At least one first stepped paste block 72 is formed in the first dielectric layer 101. The first stepped paste block 72 passes through the first dielectric layer 101 and is electrically connected to the first dielectric layer 101.

Each second circuit base board 81 includes a second dielectric layer 201 and a second wiring layer 202 formed on the second dielectric layer 201. In this embodiment, the second wiring layer 202 is embedded in the second dielectric layer 201. At least one second stepped paste block 73 is formed in the second dielectric layer 201. The second stepped paste block 73 passes through the second dielectric layer 201 and is electrically connected to the second wiring layer 202. The first wiring layer 102 of at least one first circuit base board 80 is electrically connected to the second wiring layer 202 through the first stepped paste block 72.

The first stepped paste block 72 includes a first block portion 721 adjacent to the first wiring layer 102 and a second block portion 722 connected to the first block portion 721 and facing away from the first wiring layer 102. The second stepped paste block 73 includes a third block portion 731 adjacent to the second wiring layer 202 and a fourth block portion 732 connected to the third block portion 731 and facing away from the second wiring layer 202.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A multi-layered circuit board comprising:
    at least one first circuit base board, each of the at least one first circuit base board comprising a first dielectric layer and a first wiring layer formed on the first dielectric layer, at least one first stepped paste block formed in the first dielectric layer, the at least one first stepped paste block passing through the first dielectric layer and being electrically connected to the first wiring layer; and
    at least one second circuit base board laminated on the at least one first circuit base board, wherein each of the at least one second circuit base board comprising a second dielectric layer and a second wiring layer formed on the second dielectric layer, at least one second stepped paste block formed in the second dielectric layer, the at least one second stepped paste block passing through the second dielectric layer and being electrically connected to the second wiring layer;
    wherein the first wiring layer of at least one first circuit base board is electrically connected to the second wiring layer of at least one second circuit base board through the first stepped paste block; each of the first stepped paste block and the second stepped paste block is T-shaped; the first stepped paste block comprises a first block portion adjacent to the first wiring layer and a second block portion connected to the first block portion and facing away from the first wiring layer, a width of the first block portion is decreased from the second block portion to the first wiring layer, the second stepped paste block comprises a third block portion adjacent to the second wiring layer and a fourth block portion connected to the third block portion and facing away from the second wiring layer, a width of the third block portion is decreased from the fourth block portion to the second wiring layer.

2. The multi-layered circuit board of claim 1, wherein a thickness of the second block portion and the fourth block portion is defined as D, a thickness of the first dielectric layer or the second dielectric layer is defined as T, D and T satisfy a function: $(T+10)$ micrometers $\leq D \leq (T+30)$ micrometers.

3. The multi-layered circuit board of claim 1, wherein each side of the second block portion protrudes from the first block portion by a distance, each side of the fourth block portion protrudes from the third block portion by a same distance, the distance is in a range of 10 micrometers to 50 micrometers.

4. The multi-layered circuit board of claim 1, wherein the first wiring layer of another first circuit base board is electrically connected to the second wiring layer of another second circuit base board through the first stepped paste block and the second stepped paste block.

5. The multi-layered circuit board of claim 1, wherein the second wiring layer is embedded in the second dielectric layer.

* * * * *